United States Patent [19]

Shimada et al.

[11] 4,011,467
[45] Mar. 8, 1977

[54] GATE INPUT CIRCUIT FOR INSULATED GATE FIELD EFFECT TRANSISTORS

[75] Inventors: Shunji Shimada, Kodaira; Kenichi Ohba, Fuchu; Shigeo Ishii, Tokyo, all of Japan

[73] Assignee: Hitachi, Ltd., Japan

[22] Filed: Feb. 18, 1976

[21] Appl. No.: 658,922

[30] Foreign Application Priority Data

Mar. 26, 1975 Japan .............................. 50-35604

[52] U.S. Cl. ............................. 307/251; 307/202 R; 307/205; 307/214; 307/304; 361/54; 361/88
[51] Int. Cl.² ................. H03K 17/60; H03K 17/16; H02H 9/04
[58] Field of Search ...... 307/202, 205, 214, 247 A, 307/251, 304, 237; 317/9 C, 11 C, 11 E, 12 R, 16, 31, 33 SC; 340/365 E

[56] References Cited

UNITED STATES PATENTS

| | | |
|---|---|---|
| 3,395,290 | 7/1968 | Farina et al. .................. 307/205 X |
| 3,555,374 | 1/1971 | Usuda ............................ 307/304 X |
| 3,588,525 | 6/1971 | Hatsukano et al. ........... 307/304 X |
| 3,636,385 | 1/1972 | Koepp .............................. 307/304 |
| 3,934,159 | 1/1976 | Nomiya et al. ..................... 307/304 |
| 3,947,727 | 3/1976 | Stewart .............................. 317/31 |

*Primary Examiner*—John S. Heyman
*Assistant Examiner*—Larry N. Anagnos
*Attorney, Agent, or Firm*—Craig & Antonelli

[57] ABSTRACT

In a gate input circuit for insulated gate field effect transistors, an insulated gate field effect transistor of depletion type is used, whose drain electrode (or source electrode) is connected to one terminal of a power source and whose source electrode (or drain electrode) is short-circuited with the gate electrode and connected to an input terminal of the gate input circuit through a resistor.

6 Claims, 3 Drawing Figures

GATE INPUT CIRCUIT FOR INSULATED GATE FIELD EFFECT TRANSISTORS

BACKGROUND OF THE INVENTION

1. Field of the Invention

This invention relates to a gate input circuit for transistor circuits constituted with insulated gate field effect transistors, and more particularly to a gate input circuit for semiconductor integrated circuits which prevents a gate insulator of an insulated gate field effect transistor from being broken down.

2. Description of the Prior Art

Generally speaking, in an insulated gate field effect transistor (hereinafter referred to as a field effect transistor) whose gate has a high capacitive input impedance, an unexpected electric charge of even a slight quantity induced a high voltage and caused dielectric breakdown of the gate electrode.

Accordingly, in a semiconductor integrated circuit including the field effect transistors, such a field effect transistor as connected to respective external terminals of an output signal line, power line and earth line and thus connected, between its gate and source electrodes or between its gate and drain electrodes, in parallel with other parasitic capacitances, PN-junction elements or other circuit elements bears a large parallel capacitance across its gate and source electrodes or its gate and drain electrodes and a small resistance as well so that the adverse high surge voltage will not induce a high voltage across the gate capacitance of the field effect transistor in question and there is no need to look into the problem on the dielectric breakdown of gate electrode. On the contrary, such a field effect transistor as directly connected at its gate electrode to an external terminal of semiconductor integrated circuit or connected at either its drain or source electrode to the external terminal of the same, and also connected, between its gate and source electrodes or between its gate and drain electrodes, to none of circuit elements bears a slight capacitance as viewed from the external terminal and a high resistance so that the gate insulator of field effect transistor tends to be broken down.

Especially, where an input signal to a logic circuit including field effect transistors formed in a semiconductor integrated circuit is generated in terms of a binary level of 1 and 0 by means of an external mechanical switch such as a key beard switch incorporated in a semiconductor integrated circuit of a key input circuit for an electronic desk calculator, the key switch is directly connected to a gate electrode of a field effect transistor constituting an input stage inverter through which the input signal is transmitted. Accordingly, in accordance with the switching of the key switch, the gate input circuit of the field effect transistor constituting the input stage inverter is intermittently brought into a floating condition at which the gate input circuit to the field effect transistor suffers from disadvantages in circuit operation such as erroneous operation due to noise and tendency to inducing an adverse high surge voltage. More particularly, before a completed semiconductor integrated circuit is incorporated into the electronic desk calculator set, the external input terminal to be connected with the key switch of the semiconductor integrated circuit is brought into the floating condition and accordingly, a surge voltage resulting from an unexpected transient condition due to the generation of an electrostatic charge during handling of the semiconductor integrated circuit does damage to the gate insulator of the field effect transistor. In consequence, circuit operation over the whole of semiconductor integrated circuit is disabled.

In order to prevent the floating of the gate input circuit of the field effect transistor to which the mechanical or key switch is connected, an expedient may be taken wherein another field effect transistor is combined with the mechanical switch in question. Even with this expedient, there arises a problem that a gate insulator of the combined field effect transistor is broken down.

SUMMARY OF THE INVENTION

An object of the invention is to provide a gate input circuit constituted with field effect transistors capable of preventing dielectric breakdown of gate electrodes of the field effect transistors.

Another object of the invention is to provide a gate input circuit which applies a binary level to a logic circuit of field effect transistors by means of a mechanical switch.

For attaining these objects, according to the invention, in a semiconductor integrated circuit comprising insulated gate field effect transistors, for the prevention of floating of an external input terminal to the semiconductor integrated circuit, an insulated gate field effect transistor of depletion type is used, whese drain electrode (or source electrode) is connected to one terminal of a power source and whose source electrode (or drain electrode) is short-circuited with the gate electrode and connected to the external input terminal to the semiconductor integrated circuit through a protective resistor.

BRIEF DESCRIPTION OF THE DRAWINGS

The invention will be understood more clearly from the following detailed description taken in conjunction with the accompanying drawings in which.

DESCRIPTION OF THE PREFERRED EMBODIMENTS

Figure 1:
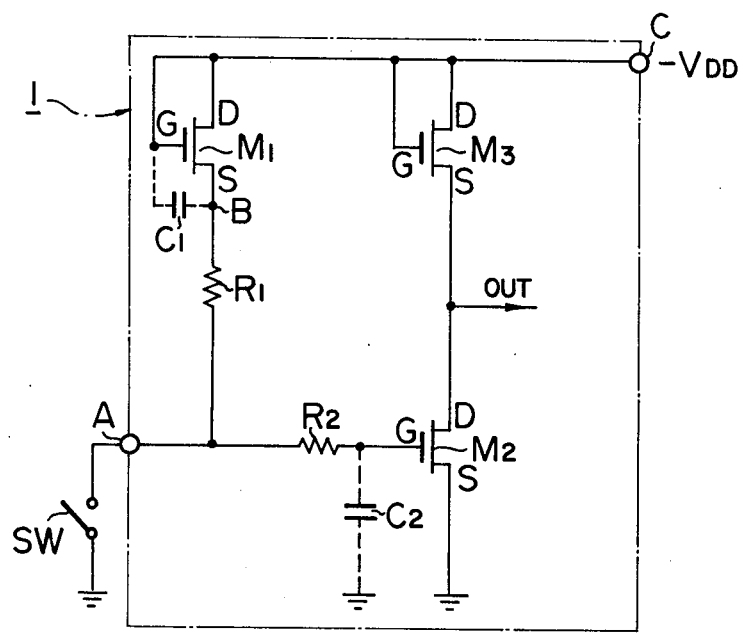
FIG. 1 is a circuit diagram useful to explain the invention.

The inventors of this invention have proposed a gate input circuit as shown in FIG. 1, in which a binary level is generated by means of a mechanical switch. Especially, in case where, as exemplified in a key input circuit for an electronic desk calculator, an input signal to a logic circuit incorporated with field effect transistors is generated in terms of a binary level of 1 and 0 levels by means of such a mechanical switch as a key board switch, a gate input circuit tends to be brought into a floating condition. In the logic circuit, therefore, it is suggested that a P-channel enhancement type field effect transistor $M_1$ is provided as shown in FIG. 1 for the purpose of preventing a floating of a gate input circuit constituted with field effect transistors $M_2$ and $M_3$ within a semiconductor integrated circuit 1. The P-channel enhancement type field effect transistor $M_1$ is connected between a negative power source $-V_{DD}$ and an input terminal A with its drain and gate electrodes short-circuited. Thus, a logic condition when the mechanical switch such as key hoard switch is opened is specifically defined to undergo a predetermined level by clamping the logic condition at a potential of the negative power source $-V_{DD}$, thereby preventing various adverse influences due to noise and the like. In addition, resistors $R_1$ and $R_2$ are provided for protecting the field effect transistors from being affected by a high voltage due to an unexpected electric charge. Apparently, symbols $C_1$ and $C_2$ designate stray capacitors for the field effect transistors $M_1$ and $M_2$, respectively.

With this arrangement, however, there arose frequently a problem that the floating prevention field effect transistor $M_1$ is damaged or broken down by an electrostatic charge developing at the external input terminal A. The reason for this is that a voltage due to the electrostatic charge developing at the external input terminal A exceeds in absolute value a negative voltage of the negative power source $-V_{DD}$ supplied to the integrated circuit 1 to bias the field effect transistor $M_1$ reversely, rendering it cut off, with the result that a voltage difference between the drain and source electrodes i.e., between the gate and source electrodes gets greater, thus causing a dielectric breakdown of the gate electrode. Therefore, the provision of the protective resistor $R_1$ becomes quite insignificant. The driver field effect transistor $M_2$ constituting an inverter, on the other hand, will not be broken down by the high voltage developing at the input terminal since the stray capacitor $C_2$ associated with the field effect transistor $M_2$ has a far larger capacitance than that of the field effect transistor $M_1$.

The invention intends to prevent the dielectric breakdown of the gate electrode of field effect transistor used for floating prevention.

Figure 2:
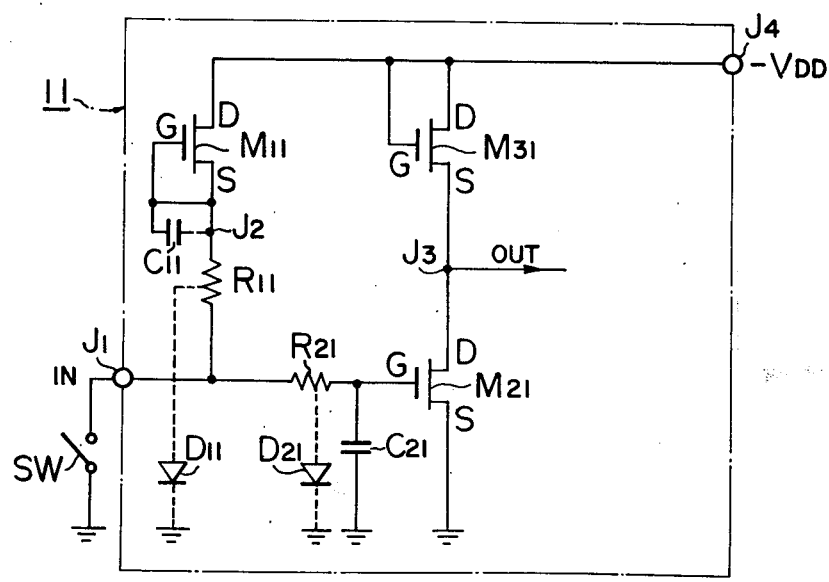
FIG. 2 is a circuit diagram of one embodiment of the invention.

Referring now of FIG. 2, there is shown a gate input circuit embodying the invention which generates a binary level of 1 and 0 levels necessary for logic operation by means of a mechanical switch such as key switch. As shown therein, an inverter circuit including a driver field effect transistor $M_{21}$ and a load field effect transistor $M_{31}$ is established in a semiconductor integrated circuit 11. Both the field effect transistors $M_{21}$ and $M_{31}$ are of a P-channel enhancement type. Connected to a gate electrode G of the driver field effect transistor $M_{21}$ is a gate protective circuit including a resistor $R_{21}$ and a capacitor $C_{21}$. If a surge voltage is applied to an input terminal $J_1$, the gate protective circuit operates to convert the high surge voltage developing at the input terminal $J_1$ into a low voltage which in turn is delivered to the gate electrode G of field effect transistor $M_{21}$. According to a well-known technique, the capacitor of gate protective circuit may be placed with a Zener diode $D_{21}$ and a voltage supplied to the gate electrode G is clamped by utilizing the constant voltage characteristics of Zener diode. As well known in the art, these protective circuits can be formed integrally with other field effect transistors in a silicon semiconductor substrate through the use of semiconductor integrated circuit technique. For example, the resistor $R_{21}$ is formed in terms of a P-conductivity region diffused into an N-conductivity silicon semiconductor substrate and the capacitor $C_{21}$ is formed in terms of a PN-junction capacitor between a P-conductivity region and an N-conductivity semiconductor substrate.

A floating prevention circuit in accordance with the invention is also inserted between the input terminal $J_1$ and the negative power source $-V_{DD}$. The floating prevention circuit includes a P-channel depletion type field effect transistor $M_{11}$ and a resistor $R_{11}$. Like resistor $R_{21}$, the resistor $R_{11}$ is formed in terms of a P-conductivity region diffused into the N-conductivity silicon semiconductor substrate. The invention izs characterized by the fact that a source electrode S of the depletion type field effect transistor $M_{11}$ is connected with a gate electrode G thereof. The use of field effect transistor $M_{11}$ reduces a resistance of the resistor $R_{11}$ so that a geometrical area occupied by the floating prevention circuit may be reduced markedly. A floating prevention circuit formed otherwise with a resistor alone needs to occupy a large area for obtaining a large resistance, resulting adverse results. Diodes $D_{11}$ and $D_{21}$ are PN-junction diodes respectively formed between P-conductivity diffused regions of resistor $R_{11}$ and $R_{21}$ and an N-conductivity semiconductor substrate (grounded).

In stationary (normal) operation, when the key switch SW is closed, the input terminal J is grounded to bear 0 level, producing an input signal. The input signal is inverted by the driver field effect transistor $M_{21}$ and a given potential of 1 level can be obtained at an output point $J_3$. The output signal is then transmitted to another logic circuit (not shown) and used therein. When the key switch is opened, a potential at the input terminal $J_1$ is clamped to a negative potential (1 level) of the power source $-V_{DD}$ and the driver field effect transistor $M_{21}$ is rendered on thereby. Accordingly, the output point $J_3$ is grounded (0 level). In this manner, a binary level signal is generated by switching the switch SW.

Next, transient (abnormal) operation that a high surge voltage generated during an unexpected transient condition is applied will be described. The surge voltage results from an electrostatic charge in an operator or noise induced from other circuits.

Now assumed that a negative high voltage due to electrostatic charge is induced at the input terminal $J_1$. At this time, since the high surge voltage is impressed across the series circuit of the field effect transistor $M_{11}$ and resistor $R_{11}$ through the power source $-V_{DD}$, a voltage at the source electrode S connected with gate electrode G of field effect transistor $M_{11}$, to which the high surge voltage is divided, is determined by a voltage division ratio between the resistor $R_{11}$ and an impedance of the field effect transistor $M_{11}$.

A voltage at the source electrode S of the transistor $M_{11}$ exceeds in absolute value a voltage at its drain electrode D equal to the negative potential of power source $-V_{DD}$ owing to the fact that the high surge voltage is applied to the input terminal. Therefore, the field effect transistor $M_{11}$ of depletion type permits a current to counterflow from the drain electrode D to source electrode S. Namely, previous source and drain electrodes S and D act presently as drain and source electrodes, respectively.

During this transient condition, the field effect transistor $M_{11}$ is taking such a connection as the electrode presently acting as drain is shortcircuited with the gate electrode, and is operating in its non-saturation region, assuming a considerably smaller impedance than that corresponding to the constant current operation in saturation region during stationary operation.

As a result, the voltage at output point $J_2$, which is determined by a voltage division ratio between the impedance of field effect transistor $M_{11}$ and the resistance of protective resistor $R_{11}$ in such a manner that the high surge voltage is substantially impressed across the resistor $R_{11}$, is reduced in absolute value, thereby preventing the gate electrode of field effect transistor $M_{11}$ from being broken down.

If a positive electrostatic charge is applied to the external input terminal $J_1$, the positive high voltage is by-passed through the equivalent PN-junction diodes $D_{11}$ and $D_{21}$ respectively formed between P-conductivity regions of the resistors $R_{11}$ and $R_{21}$ and the N-conductivity semiconductor substrate so that breakdown of the gate electrodes of field effect transistors $M_{11}$ and $M_{21}$ may again be prevented.

The invention requires the depletion type field effect transistor $M_{11}$ to have the gate electrode G short-circuited with the source electrode S except for a case in which the invention is exemplified in another embodiment to be described later, and the field effect transistor $M_{11}$ with its gate electrode G short-circuited with its drain electrode D should not be used. The reason for this will be described below.

It is assumed that a field effect transistor $M_{11}$ of, for example, P-channel depletion with its gate electrode G short-circuited with its drain electrode D is used. If a negative high voltage is applied to the input terminal to cause a current to counterflow from the electrode presently acting as drain D to the electrode presently acting as source S, the field effect transistor $M_{11}$ with its gate electrode G short-circuited with the source electrode S (previous drain electrode D) will operate in its saturation region. Therefore, the field effect transistor $M_{11}$ bears an impedance larger than that for the stationary operation with the result that a potential at the output point $J_2$ to be determined by a voltage division ratio between the impedance and a resistance of the resistor $R_{11}$ increases in absolute value, giving rise to the prior art dielectric breakdown problem.

The invention is not limited to the foregoing embodiment but realized in various alternations.

Figure 3:
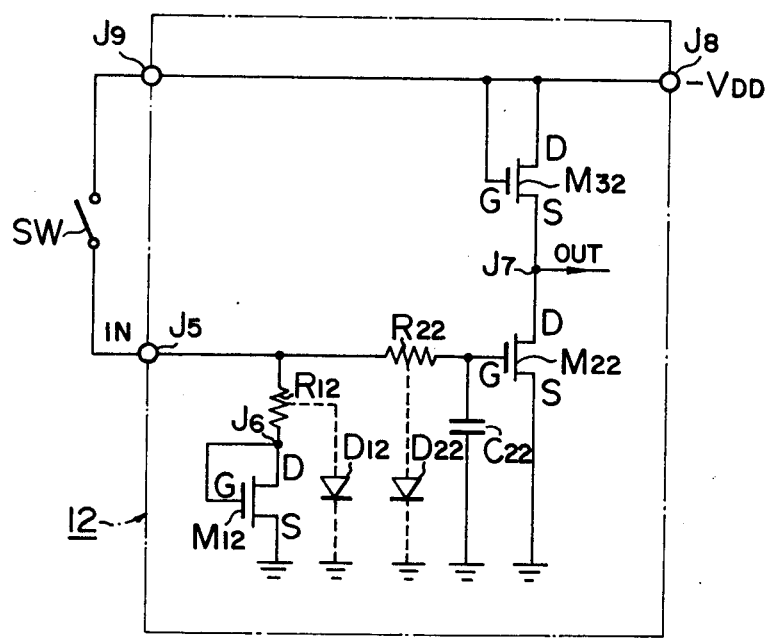
FIG. 3 is a circuit diagram of another embodiment of the invention.

While, in the foregoing embodiment, a circuit has been described wherein a negative level equal to the potential of negative power source $-V_{DD}$ is obtained for specifically defining the logic level when the key switch SW is opened, the ground level may be used for the specific definition of logic level. To this end, a field effect transistor $M_{12}$ is provided on the ground side and a protective resistor $R_{12}$ is connected to an input terminal $J_5$, as shown in FIG. 3. The gate and drain electrodes G and D of the field effect transistor $M_{12}$ of P-channel depletion type are connected in common, and the resistor $R_{12}$ is inserted between the external input terminal $J_5$ to a semiconductor integrated circuit 12 and the drain electrode D of field effect transistor $M_{12}$. With this arrangement, when a negative surge voltage is applied to the input terminal $J_5$, the field effect transistor $M_{12}$, like the field effect transistor $M_{11}$ of the embodiment shown in FIG. 1, will operate in its non-saturation region and bear a small equivalent resistance. In consequence, a voltage at a juncture $J_6$ will be decreased in absolute valve so that the gate insulator of field effect transistor $M_{12}$ will be prevented from being broken down.

It will be appreciated that, in addition to the provision of the protective resistors $R_{11}$ and $R_{12}$ standing for protective means, clamp diodes may be provided in parallel with these protective resistors in order to enhance the protective effect.

The invention may widely be applied to input circuits for semiconductor integrated circuits using field effect transistors.

We claim:

1. A gate input circuit to an insulated gate field effect transistor in an integrated circuit comprising:
    a. first and second power source lines to which a power source is connected;
    b. first and second insulated gate field effect transistors connected in series between the first and second power source lines for constituting an inverter circuit, said first insulated gate field effect transistor acting as a driver transistor and said second insulated gate field effect transistor acting as a load transistor;
    c. an input terminal;
    d. a third insulated gate field effect transistor of depletion type with a control electrode and first and second output electrodes, said control electrode being connected to the first output electrode and said second output electrode being connected to one line of the first and second power source lines;
    e. a resistor connected between the input terminal and the first output electrode of the third insulated gate field effect transistor;
    f. means for connecting the input terminal to the gate electrode of the first insulated gate field effect transistor; and
    g. switching means connected between the other line of the first and second power source lines and the input terminal.

2. The gate input circuit according to claim 1, wherein the connecting means comprises an integration circuit including a resistor and a capacitor.

3. The gate input according to claim 1, wherein the second output electrode of the third transistor is connected to the first power source line, and one end of the switching means is connected to the second power source line, whereby an electric signal produced between the input terminal and the second power source line by the action of the switching means is applied to the first insulated gate field effect transistor.

4. The gate input circuit according to claim 1, wherein the switching means comprises a mechanical switch.

5. The gate input circuit according to claim 1, wherein the first and second transistors comprise insulated gate field effect transistors of P-channel enhancement type.

6. The gate input circuit according to claim 1, wherein the third transistor comprises a P-channel.

* * * * *